United States Patent [19]

Pekau et al.

[11] 4,175,823
[45] Nov. 27, 1979

[54] PROCESS FOR HOLOGRAPHIC RECORDING OF DATA IN THE FORM OF ELECTRICAL SIGNALS

[75] Inventors: Dietlind Pekau, Taufkirchen; Hartwig Ruell, Otterfing; Eckhard Storck, Munich; Horst Kiemle, Neuried, all of Fed. Rep. of Germany

[73] Assignee: Siemens Aktiengesellschaft, Berlin & Munich, Fed. Rep. of Germany

[21] Appl. No.: 700,839

[22] Filed: Jun. 29, 1976

Related U.S. Application Data

[63] Continuation of Ser. No. 521,390, Nov. 6, 1974, abandoned.

[30] Foreign Application Priority Data

Nov. 7, 1973 [DE] Fed. Rep. of Germany ....... 2355683

[51] Int. Cl.$^2$ .............................................. G02B 27/00
[52] U.S. Cl. ........................... 350/3.79; 179/100.3 G; 358/130
[58] Field of Search ....................... 350/3.5, 3.60–3.86; 179/100.3 G; 358/130; 178/6.7 R, 6.7 A

[56] References Cited

U.S. PATENT DOCUMENTS

| | | | |
|---|---|---|---|
| 3,758,187 | 9/1973 | Thomas et al. | 350/3.5 |
| 3,809,453 | 5/1974 | Ruell et al. | 350/3.5 |
| 3,812,496 | 5/1974 | Brooks | 350/3.5 X |
| 3,936,140 | 2/1976 | Ruell | 350/3.5 |

Primary Examiner—John K. Corbin
Assistant Examiner—John D. Lee
Attorney, Agent, or Firm—Hill, Van Santen, Steadman, Chiara & Simpson

[57] ABSTRACT

A process of recording information which is in the form of electrical signals by pulse amplitude modulating an object wave and directing it with a reference wave onto a moving light-sensitive storage medium to record hybrid holograms thereon characterized in that the object beam is split into a plurality of parallel object beams each of which is individually and separately pulse modulated with a separate signal to be recorded, focusing the parallel modulated beams into an astigmatic object wave and focusing the reference wave into an astigmatic reference wave, with each wave having a focal line extending parallel to the direction of feed being coplanar and each wave having a focal line which is extending perpendicular to the direction of feed being mirror symmetrical to the storage medium. Preferably, the rate of advance or feed of the storage medium is controlled so that the individual holograms are overlapping.

1 Claim, 4 Drawing Figures

PROCESS FOR HOLOGRAPHIC RECORDING OF DATA IN THE FORM OF ELECTRICAL SIGNALS This is a continuation, of application Ser. No. 521,390, now abandoned filed Nov. 6, 1974.

BACKGROUND OF THE INVENTION

1. Field of the Invention

The present invention is directed to a method for the holographic recording of data which is in the form of electrical signals which signals are used to pulse modulate an object wave which is recorded with a coherent reference wave to produce hybrid holograms on a moving light-sensitive storage medium.

2. Prior Art

In order to achieve invariance in response to translation of a reconstructed image point at right angles to the storage plane, it has been suggested in the U.S. Pat. No. 3,809,453 to use astigmatic reference and object waves which have focal lines which are the same distance from the one-dimensional hologram and extend parallel to the storage plane in a direction at right angles to the direction of movement of the storage medium. In this case, the one-dimensional holograms are sequentially recorded in different parallel tracks of the tapelike storage medium with the tracks extending in the direction of movement or feed of the storage medium and being spaced apart in a direction extending perpendicular to the direction of movement.

For read-out of the stored one-dimensional holograms and in order to reconstruct the information stored therein, the storage medium is conducted past a reference light source which directs a light beam onto the storage medium and the cross section of the beam is equal to the size of the individual holograms. The light beam must be conducted over the storage medium at right angles to the direction of the tape feed in order to scan the various hologram tracks. If the read-out or reconstruction light beam does not precisely overlap the one-dimensional hologram, a noticeable signal fading occurs which is due to the widening of the optically reconstructed signal which widening is caused by diffraction and this misalignment also leads to less energy being available in the reconstructed beam.

SUMMARY OF THE INVENTION

The present invention is directed to an improved process for the holographic recording which eliminates or reduces read-out inaccuracies, increases the storage density and increases the rate or speed for both recording and retrieving data. To accomplish this aim, the process of holographic recording information on a moving light-sensitive storage medium includes projecting a reference wave and an object wave which is pulse modulated with the information to be recorded onto the moving storage medium to record a hybrid hologram thereon and includes improvements of splitting the object wave into a plurality of parallel beams, separately pulse modulating each of the plurality of the parallel beams with bits of information to be recorded, focusing the plurality of pulse modulated object beams of the object wave with the bits of information in parallel, focusing the reference wave, said focusing of the object and reference waves causing the waves to be source point symmetrical in the direction of feed of the storage medium and with a focal line of each of the object and reference waves being adjusted such that hybrid holograms, which have parallel stored bits, are recorded on the medium and are Fourier-invariant at right angles to the direction of feed, and controlling the rate of feed of the storage medium so that the holograms partially overlap in the direction of feed of the storage medium. Preferably, the focusing of the object wave and the reference wave produces astigmatic object and reference waves and the focal lines of each wave which extend substantially parallel to the direction of feed are substantially coplanar and the focal lines of each wave which extend perpendicular to the direction of feed are mirror symmetrical to the storage plane.

DESCRIPTION OF THE PREFERRED EMBODIMENT

The principles of the present invention are particularly useful in recording a hybrid hologram 2 on a light-sensitive storage medium 1 which is moved in a direction of feed indicated by the arrow X. The term hybrid hologram is used in the context to be understood as a hologram which exhibits translation-invariance properties in two directions but not at right angles to these directions.

In order to obtain hybrid holograms the recording geometry is selected so that holograms recorded on the storage medium are invariant in relation to undesired displacements in the storage plane which displacements are at right angles to the direction of feed and in the storage plane. A few holograms are superimposed to the direction of feed and are invariant with respect to translations at right angles to the direction of feed and at right angles to the storage plane.

To record a hybrid hologram preferably an astigmatic object wave OW and an astigmatic reference wave RW are utilized. The reference wave RW has a source line 3 and the object wave OW has a source line 4 which lines 3 and 4 are arranged source symmetrically to the hologram.

Figure 1:
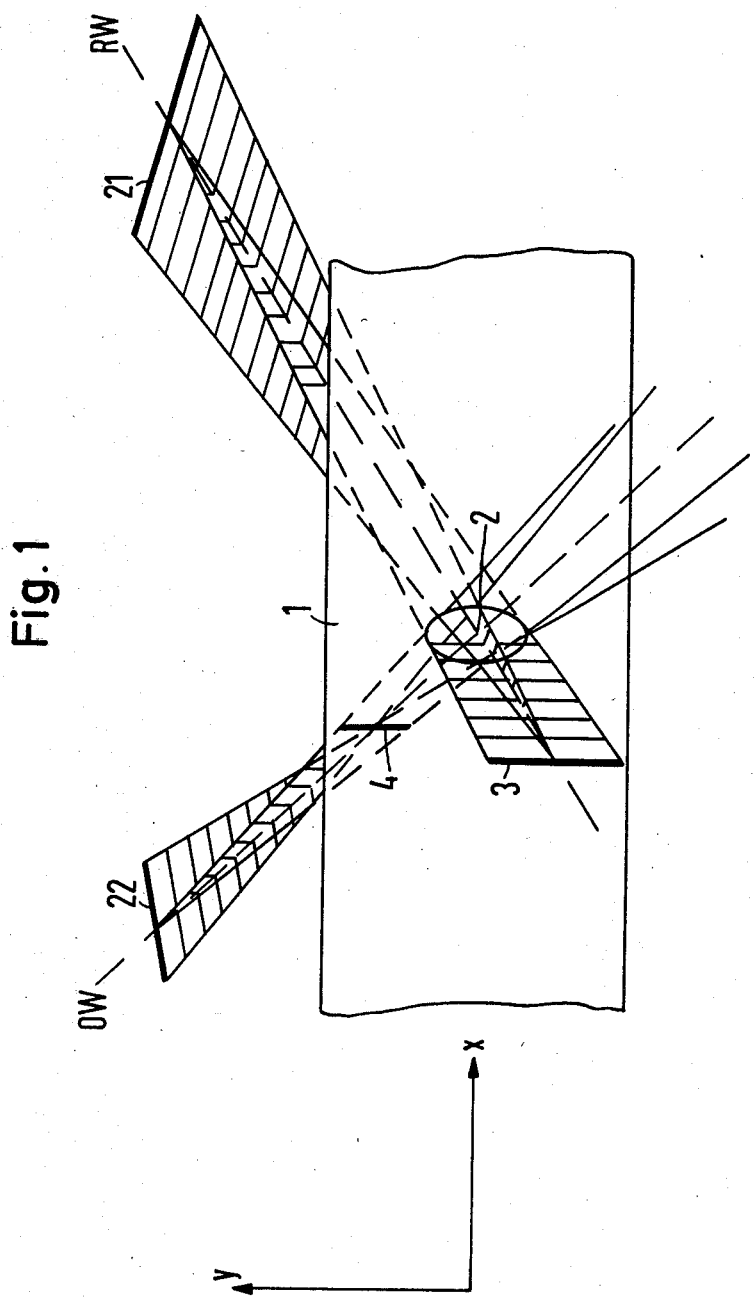
FIG. 1 is a schematic illustration of an arrangement for preforming the present invention utilizing astigmatic waves.

On one hand, in order to achieve the desired invariance in respect to undesirable translation in the Y direction and on the other hand to retain the advantage of source-symmetrical arrangement of the object and reference wave source points, astigmatic object and reference waves are used. The focal lines 21 and 22 of the reference and object waves, which extend parallel to the direction of feed and which are illustrated as being horizontal focal lines 21 and 22 in FIG. 1, are on one side of the storage medium 1 and are coplanar so that the hybrid hologram 2 has Fourier-invariance properties in the Y direction. The focal lines 3 and 4 of the reference and object waves, which extend perpendicular to the feed direction X, are adjusted to be mirror symmetrical to the plane of the storage medium 1 and are closer to the storage medium than the horizontal focal lines 21 and 22 (see FIGS. 1 and 3).

If the storage medium 1 executes a small undesirable movement in the Y direction, the reconstructed images do not make this movement on account of the Fourier properties in the Y direction of the recorded holograms. In order to keep low the number of holograms sequentially superimposed in the direction of movement and thus, in accordance with the present invention, to optimize the degree of diffraction efficiency, the vertical focal lines (the focal lines extending parallel to the Y direction) are adjusted to be at a short distance from the storage medium 1.

Figure 2:
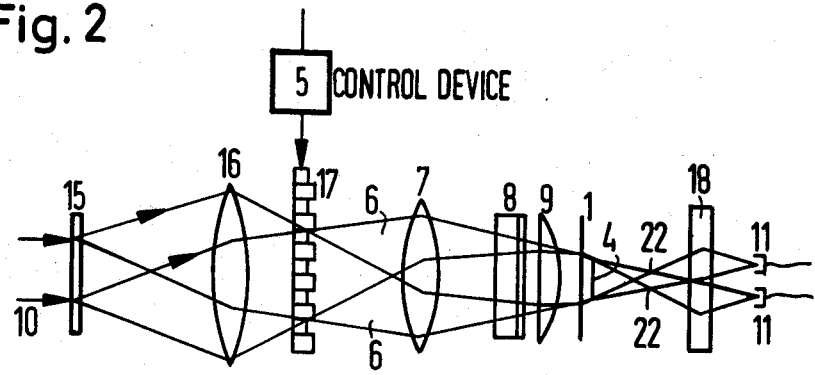
FIG. 2 is a side view of a schematic presentation of an apparatus for performing the present invention.
Figure 3:
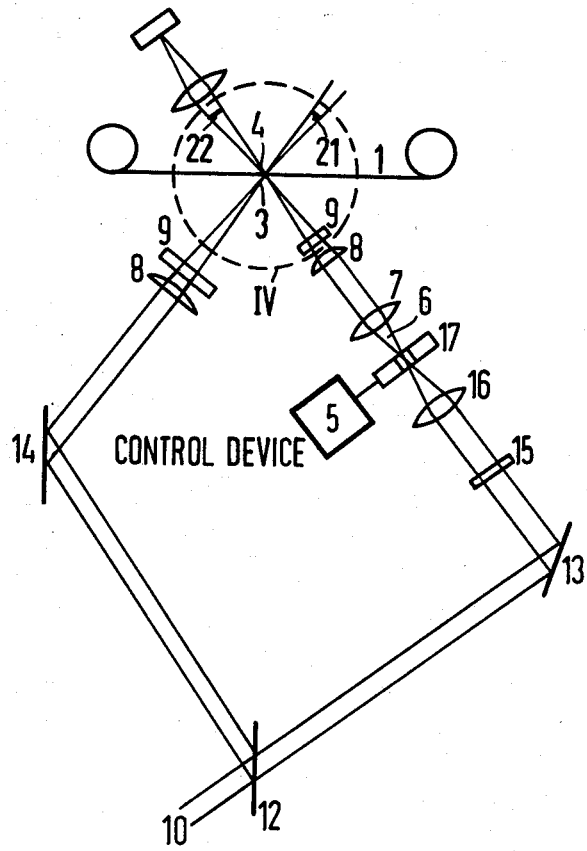
FIG. 3 is a plan view of an apparatus illustrated in FIG. 2.
Figure 4:
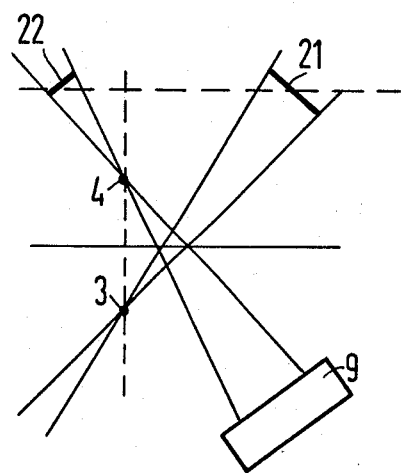
FIG. 4 is an enlarged view of the portion encompassed by the broken line circle IV of FIG.3.

Astigmatic waves can for example be produced by two cylindrical lenses whose axes are at right angles to one another as illustrated in FIGS. 2 and 3. The focal length of these lenses and the interval between the lenses and storage medium are selected to be such that the vertical focal lines (the focal lines extending in the Y direction) lie in mirror symmetry preferably closely in front of and behind the storage medium whereas the horizontal focal lines 21 and 22 (extending in the X direction) are adjusted to have a portion in one plane parallel to the plane of the storage medium 1 and thus the hologram plane.

To perform the process of the present invention, a laser beam 10, which is unmodulated and is preferably a beam comprising a series of pulses of constant intensity, is directed at beam divider 12 to produce a reference wave RW and an object beam OB. The object beam OB is reflected by a mirror 13 through a passive beam multiplier 15, for example a linear fly eye lens array, or a specially designed diffraction grating which divides or splits the original beam OB into a plurality of parallel beams. The plurality of parallel beams are focused by spherical lens 16 so that each parallel beam is received by a separate modulator portion of a linear input transducer 17. The transducer 17 may be a monodimensional input transducer of a type which consists of a linear arrangement of individual operative modulators which permit separate modulation of each of the plurality of split beams to produce a plurality of individual data channels containing independently modulated laser beams. Examples of the individually operated modulators are electro-optical transducers and acousto-optical transducers which will modulate each of the individual beams with a pulse modulation in response to a control signal applied to each of the transducers. As illustrated, each transducer portion of the transducer 17 is an electro-optical transducer separately receiving a control signal from a device 5 which may be a demultiplexer 5 that applies a separate signal to each portion.

The input transducer 17, pulse modulates the individual beams to produce separate modulated laser beams 6 (only 2 illustrated) which are focused by a spherical lens 7 and then focused by a pair of cylindrical lenses 8 and 9 whose axes are at right angles so that the lens 8 is a vertical cylindrical lens and the lens 9 is a horizontal lens. Lenses 8 and 9 produce the focal lines discussed hereinabove and are positioned so that one focal line extends substantially parallel to the direction of movement of the tape 1 of the storage medium, and a second focal line extends perpendicular to that direction.

To receive the reconstructed images during read-out, these images are matched by some sphero-cylindrical lens 18 to a matrix of photo detectors 11 which is arranged on the opposite side of the tape 1.

The reference wave RW upon leaving the beam splitter or divider 12 is reflected by a mirror 14 through a pair of cylindrical lenses 8 and 9 whose axes are arranged in perpendicular relation so that the lens 8 is a vertical lens and lens 9 is a horizontal lens. Lenses 8 and 9 form the above-mentioned focal lines with one focal line extending substantially parallel to the direction of movement of the storage medium or tape 1, and the other focal line extending perpendicular to that direction.

As illustrated, the storage medium 1, which is in the form of a tape, extends between a pair of rolls or reels 20 which rotate to move the tape during the recording operation. The speed of movement of the tape 1 is controlled by the speed of rotation or winding of the reels or rolls 20. With each pulse of the beam 10, one hologram can be recorded. If the speed of movement of the tape is controlled between pulses of the beam 10, the next recorded hologram can overlap previously recorded holograms. In accordance with the process, a conventional deflecting device can be utilized to deflect the object wave and reference wave in a direction perpendicular to the movement of the tape to sequentially record holograms in parallel tracks which extend along the direction of movement of the tape 1.

By splitting the object beam OB into a plurality of parallel beams and by modulating each of these beams with a bit of information, n bits can be stored in parallel in each hologram 2. Thus, the storage factor for each hologram is n. Since the hologram 2 can be sequentially recorded in spaced tracks and a few holograms can be in overlapping or superimposed relation in the direction of feed, the storage density is greatly increased per unit length of tape 1. Also, in accordance with the process of the present invention, less spacing is required for safety clearance between the tracks which extend across the width of the storage medium. Therefore, with a higher storage density per unit length of tape 1, the rate or speed of recording and retrieval is increased. Furthermore, the difficulties, which arise due to the guidance inaccurracies during read-out of the stored signals, are highly non-problematic.

Although various minor modifications might be suggested by those versed in the art, it should be understood that we wish to employ within the scope of the patent granted hereon all such modifications as reasonably and properly come within the scope of our contribution to the art.

We claim:

1. In a process of holographically recording information on a moving light-sensitive storage medium including projecting a reference wave and an object wave which is pulse modulated with the information to be recorded onto the moving storage medium to record a hologram thereon, the improvements comprising splitting the object wave into a plurality of parallel beams; separately pulse modulating each of the plurality of parallel beams with bits of information to be recorded to produce an object wave with a plurality of pulse modulated beams; focusing the object wave with the bits of information in parallel; focusing the reference wave, said steps of focusing of the object wave and reference wave producing astigmatic object and reference waves respectively with horizontal focal lines of each of said wave extending substantially parallel to the direction of feed and vertical focal lines of each wave extending perpendicular to the direction of feed, said steps of focusing adjusting the positions of the focal lines of the waves with the horizontal focal lines being disposed on one side of the storage medium and substantially in a plane extending parallel to the storage medium and the vertical focal lines being mirror symmetrical to the storage plane and closer to the storage plane than said horizontal focal lines so that the holograms, which have parallel stored bits, are recorded on the medium and are Fourier invariant at right angles to the direction of feed; and controlling the rate of feed of the storage medium so that the holograms partially overlap in the direction of feed of the storage medium.

* * * * *